United States Patent [19]

Hara et al.

[11] Patent Number: 4,971,415
[45] Date of Patent: Nov. 20, 1990

[54] MULTIBEAM EMITTING DEVICE

[75] Inventors: Toshitami Hara; Akira Shimizu, both of Tokyo; Yoshinobu Sekiguchi; Seiichi Miyazawa, both of Kawasaki; Hidetoshi Nojiri, Matsudo; Isao Hakamada, Yokohama, all of Japan

[73] Assignee: Canon Kabushiki Kaisha, Tokyo, Japan

[21] Appl. No.: 312,311

[22] Filed: Feb. 17, 1989

Related U.S. Application Data

[63] Continuation of Ser. No. 797,492, Nov. 13, 1985, abandoned.

[30] Foreign Application Priority Data

| Nov. 16, 1984 | [JP] | Japan | 59-240418 |
| Nov. 19, 1984 | [JP] | Japan | 59-242289 |
| Nov. 22, 1984 | [JP] | Japan | 59-246284 |
| Nov. 26, 1984 | [JP] | Japan | 59-248229 |
| Jan. 7, 1985 | [JP] | Japan | 60-156 |
| Jan. 8, 1985 | [JP] | Japan | 60-424 |

[51] Int. Cl.⁵ .................... G02B 6/12; G02B 26/08; H01S 3/19; H01L 33/00
[52] U.S. Cl. .................... 350/96.11; 350/6.8; 350/96.12; 372/24; 372/46; 372/50; 372/96; 372/97; 357/17
[58] Field of Search ............ 372/24, 45, 49, 46, 372/50, 96, 97, 107, 92, 99; 350/96.11, 96.12, 6.8; 357/17, 16

[56] References Cited

U.S. PATENT DOCUMENTS

| 3,465,159 | 9/1969 | Stern | 250/213 |
| 3,982,810 | 9/1976 | Tamir et al. | 350/96.12 |
| 4,286,838 | 9/1981 | Huignard et al. | 372/50 |
| 4,309,667 | 1/1982 | DiForte et al. | 372/50 |
| 4,318,058 | 3/1982 | Mito et al. | 372/50 |
| 4,360,921 | 11/1982 | Scifres et al. | 372/50 |
| 4,445,759 | 5/1984 | Valette | 350/96.12 |
| 4,470,143 | 9/1984 | Kitamura et al. | 372/50 |
| 4,475,200 | 10/1984 | Lee | 372/46 |
| 4,565,421 | 1/1986 | Minoura | 350/6.8 |
| 4,571,021 | 2/1986 | Minoura et al. | 350/6.8 |
| 4,578,791 | 3/1986 | Chen | 372/50 |
| 4,603,421 | 7/1986 | Scifres et al. | 372/50 |
| 4,607,370 | 8/1986 | Mukai et al. | 372/50 |
| 4,631,729 | 12/1986 | Goodwin et al. | 372/44 |
| 4,649,351 | 3/1987 | Veldkamp et al. | 372/97 |
| 4,672,062 | 12/1986 | Bender | 372/36 |
| 4,799,229 | 1/1989 | Miyazawa et al. | 372/50 |

FOREIGN PATENT DOCUMENTS

| 43-28904 | 12/1968 | Japan . | |
| 55-30870 | 3/1980 | Japan . | |
| 48981 | 3/1983 | Japan | 372/96 |
| 51822 | 3/1985 | Japan | 350/96.11 |
| 154694 | 8/1985 | Japan | 372/50 |

OTHER PUBLICATIONS

Polyurethane Fan-Out Waveguide Array for High Resolution Optical Waveguide Imaging, Ramey et al., Dec. 1979, IEEE Transactions on Circuits & Systems.
Gradient-Index Planar Microlens Makes Possible a Stacked Optical Integrated Circuit, Iga et al., May 1984, Laser Focus/Electro-Optics.
Andreeva et al., Sov. Phys. Tech. Phys. 27(7), pp. 891–892, Integrated Laser-Photoreceiver Pair, Jul. 1982.
Moriki et al., Electronics Letters, vol. 17, No. 16, pp. 559–560, 1.3 μm-Wavelength Mode Controlled GaInAsP/InP Etched Laser, Aug. 6, 1981.
Appl. Phys. Lett. 33(8), pp. 702–704, Beam Scanning with Twin-Stripe Injection Lasers, Oct. 15, 1978.
Appl. Phys. Lett. 43(5), pp. 432–434, Transverse Second-Order Mode Oscillations in a Twin-Stripe Laser with Asymmetric Injection Currents.

*Primary Examiner*—Eugene R. LaRoche
*Assistant Examiner*—Michael B. Shingleton
*Attorney, Agent, or Firm*—Fitzpatrick Cella Harper & Scinto

[57] ABSTRACT

In a multibeam emitting device provided with a plurality of semiconductive light-emitting elements monolithically formed on a semiconductor substrate, the semiconductor light-emitting elements are formed so that the directions of emission of the lights emitted from the elements differ from one another.

6 Claims, 16 Drawing Sheets

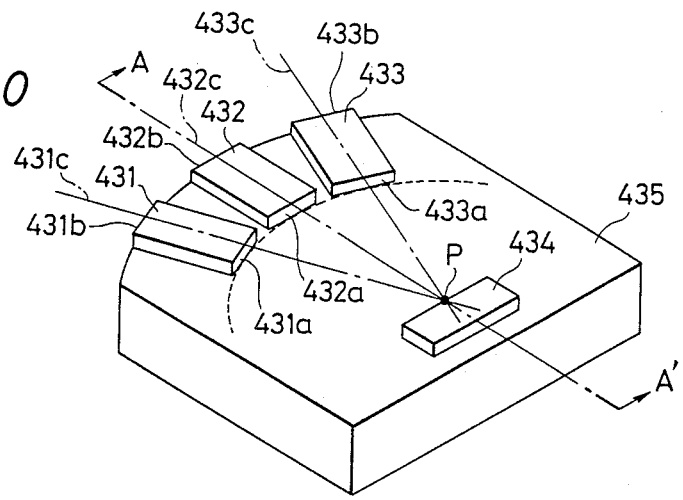
FIG. 30
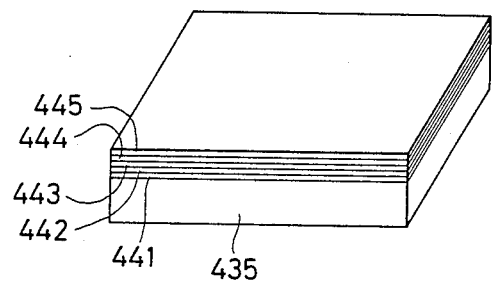
FIG. 31
FIG. 32
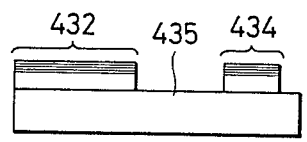
FIG. 33
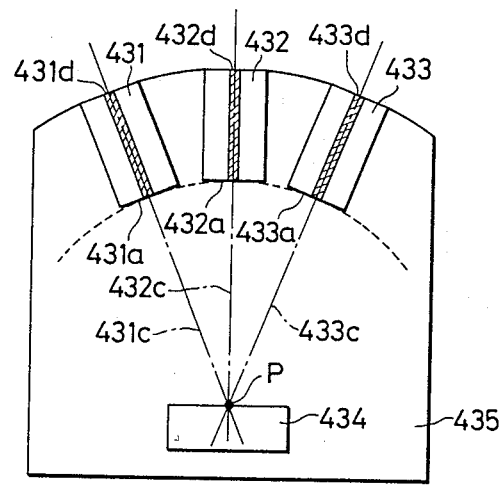

MULTIBEAM EMITTING DEVICE

This application is a continuation of application Ser. No. 797,492, filed Nov. 13, 1985, now abandoned.

BACKGROUND OF THE INVENTION

1. Field of the Invention

This invention relates to a multibeam emitting device provided with a plurality of semiconductive light-emitting elements monolithically formed on a semiconductor substrate. The device of the present invention may be suitably used as the light source of a plural-beam scanning apparatus for scanning a multibeam on a recording medium and effecting the recording or the like of information

2. Description of the Prior Art

As disclosed, for example, in U.S. application Ser. No. 504,420 (filed on Jan. 15, 1983), when designing a light scanning apparatus by the use of a plurality of beam emitting devices such as laser diodes (LDs) or light-emitting diodes (LEDs), there has heretofore been known a method which comprises disposing the beam emitting devices so that the directions of emission of the lights from the beam emitting devices intersect one another at a point Po as shown in FIG. 1 of the accompanying drawings, and scanning a plurality of scanning spots relative to a surface to be scanned while keeping a good imaged state.

FIG. 1 of the accompanying drawings shows a typical example of the prior art and is a view of the optical system between a light source and a deflector as seen from a direction perpendicular to a deflecting-scanning plane. In FIG. 1, reference characters 71a and 71b designate beam emitting devices each comprising a laser diode. The devices 71a and 71b are disposed on a mount 72 as if the central rays ha and hb of the lights emitted from the devices 71a and 71b passed through the same point Po. In other words, if normals are drawn to the beam emitting surfaces of the respective devices, the normals are set so as to intersect each other at the point Po. Further, if seen from a direction parallel to the deflecting-scanning plane, the position at which the central rays ha and hb pass through the point Po is set so as to slightly deviate in a direction orthogonal to the deflecting-scanning plane. Also, said point Po and a point P near the deflecting-reflecting surface 73 of the deflector are kept in an optically conjugate relation by an imaging lens 74.

On the other hand, to obtain an effect similar to that shown in FIG. 1 where a monolithically formed laser diode array or the like is used as a light source, it is necessary to provide some optical system between the light source and the deflector. In the example disclosed in U.S. application Ser. No. 500,072 (filed on June 1, 1983), a prism is disposed in front of a laser diode array. This is shown in FIG. 2 of the accompanying drawings.

FIG. 2 shows the cross-section of the prism in a case where the laser diode array has five light-emitting elements. In FIG. 2, reference numeral 81 designates the laser diode array having five light-emitting elements 81a, 81b, 81c, 81d and 81e, and reference numeral 82 denotes the prism. The central ray ha of the light beam from the light-emitting element 81a is refracted by an inclined surface 82a and bent as if it passed through the point Po. The central ray hb from the light-emitting element 81b, the central ray hd from the light-emitting element 81d and the central ray he from the light-emitting element 81e are bent by inclined surfaces 82b, 82d and 82e, respectively, as if they passed through the point Po. The central ray hc from the light-emitting element 81c passes perpendicularly through a flat surface 82c, and the point Po exists on the extension of this central ray hc. In this manner, there are provided inclined flat surfaces having their angles of inclination determined correspondingly to the respective light-emitting elements, and the central rays of the light beams after having emerged from the prism 82 have their directions controlled as if they were emitted from the point Po. This point Po, as previously described, is kept conjugate with a desired point P (not shown) near the deflecting-reflecting surface through an optical system.

On the other hand, FIG. 3 of the accompanying drawings shows an arrangement for providing a similar effect by a relay optical system 93. In FIG. 3, the relay system 93 is interposed between a collimator lens 92 for collimating and imaging lights emitted from the light-emitting elements 91a and 91b of a laser diode array and a cylindrical lens 95 to image the lights on the reflecting surface 94 of a rotational polygon mirror, and the lights are imaged on a surface to be scanned (not shown) in a good imaged state.

The problem in this case is the length of the optical path, that is, the length of the optical path of the relay system itself is longer by about 20 cm.

SUMMARY OF THE INVENTION

It is an object of the present invention to provide a multibeam emitting device which, without using any additional optical system, can constitute a beam scanning apparatus in which the length of the optical path is short and which is good in the imaged state of the scanning spot.

It is another object of the present invention to provide a multibeam emitting device which is easy to manufacture and can be simply adjusted when incorporated into a beam scanning apparatus or the like.

The above objects of the present invention are achieved by a multibeam emitting device which is provided with a plurality of semiconductive light-emitting elements monolithically formed on a semiconductor substrate and in which the elements are formed so that the directions of emission of lights emitted from the elements differ from one another.

The expression appearing in the following description that "the directions of emission of lights emitted from the elements differ from one another" does not mean that there is no set of lights emitted in the same direction, but broadly means that there is one or more sets of lights different in direction of emission.

BRIEF DESCRIPTION OF THE DRAWINGS

FIGS. 30, 31, 32 and 33 are schematic views showing a ninth embodiment of the present invention.

DESCRIPTION OF THE PREFERRED EMBODIMENTS

Some embodiments of the present invention will hereinafter be described with reference to the drawings.

Figure 1:
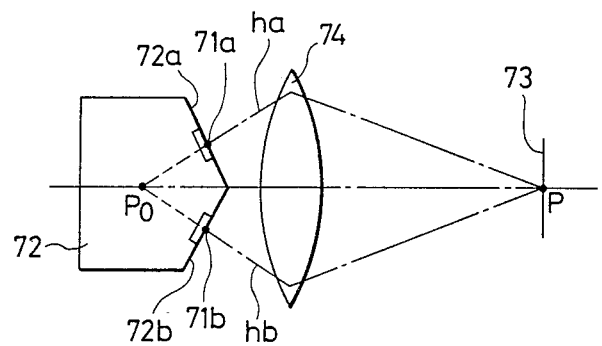
FIGS. 1, 2 and 3 are schematic views showing the constructions of multibeam emitting devices according to the prior art.
Figure 2:
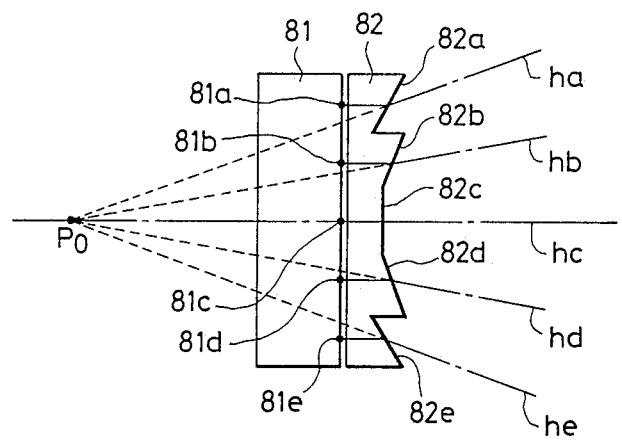
Figure 3:
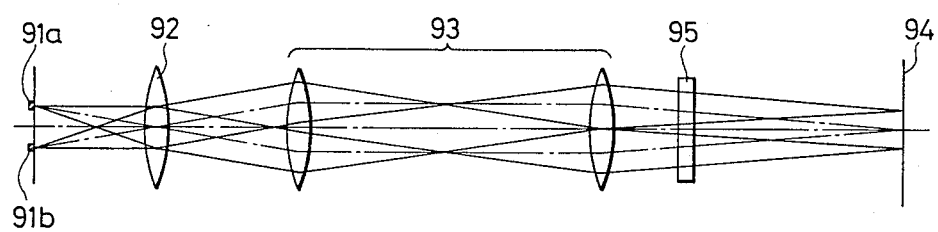
Figure 4:
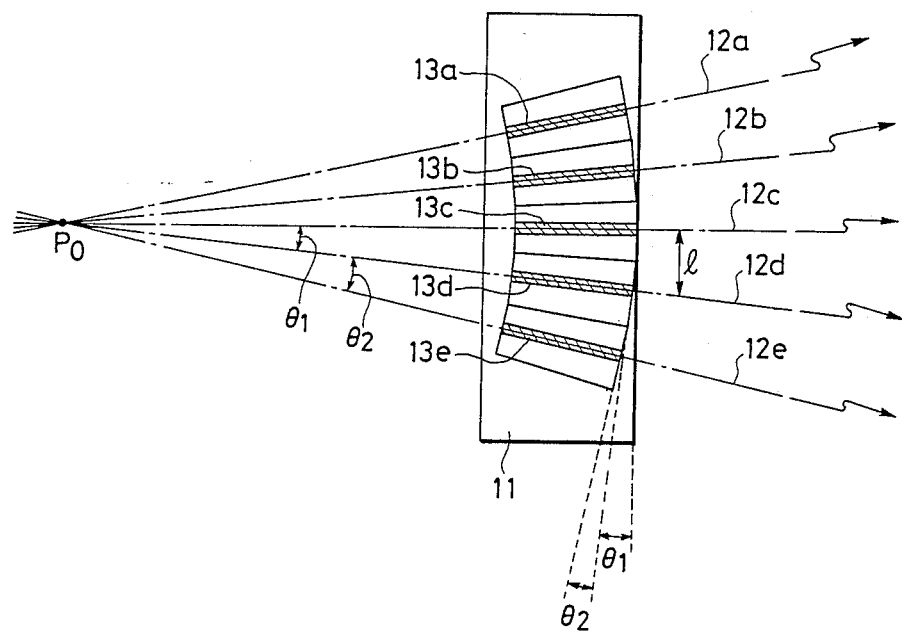
FIG. 4 is a plan view showing a first embodiment of the present invention.

FIG. 4 shows a first embodiment of the present invention. Semiconductors are layered on a GaAs substrate 11 so as to constitute, for example, a double hetero structure, whereafter a plurality of semiconductive light-emitting elements are formed into a sector pattern as shown by a photomask. The light-emitting end surfaces of the respective elements are formed so as to form a finite angle $\theta_1$ or $\theta_2$ ($\theta_1, \theta_2 \neq 0$) with one another. Opposed surfaces which form Fabry-Perot resonance surfaces with said light-emitting end surfaces are likewise formed so as to form an angle $\theta_1$ or $\theta_2$ and therefore, the resonance direction differs between the elements, and the directions of light emission 12a–12e have an angle $\theta_1$ or $\theta_2$, respectively. In this case, by the directions of light emission being formed as if lights were emitted from a point Po opposite from the emergence side, the additional components such as the aforementioned prism 82 (FIG. 2) and the aforementioned relay optical system 93 (FIG. 3) become unnecessary. Thus, a light source from which a good imaged state can be obtained by a device utilizing a simple scanning optical system can be realized. In FIG. 4, reference characters 13a–13e designate areas into which a current is introduced.

It is generally convenient in designing the device to use a predetermined value (namely, $\theta_1 = \theta_2$) as the intervals l between said elements and the angle $\theta$ ($\theta_1, \theta_2$) formed by the directions of emission, but this is not always necessary. The relation between l and $\theta$ depends on the focal length of the optical system, particularly the collimator lens, of the device in which it is incorporated. That is, if the distance between the collimator lens and the point Po is L(Po), the relation that $L(Po) \times \theta = l$ is established when the distance between the collimator lens and the element is small as compared with L(Po). $\theta$ is expressed in radian. For example, $\theta$ is about 1 degree when L(Po) is 13 mm and l=100 μm.

Figure 5:
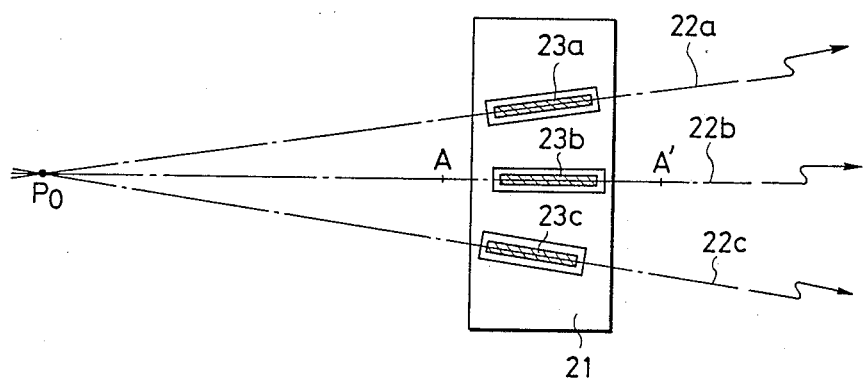
FIG. 5 is a plan view showing a second embodiment of the present invention.
Figure 6:
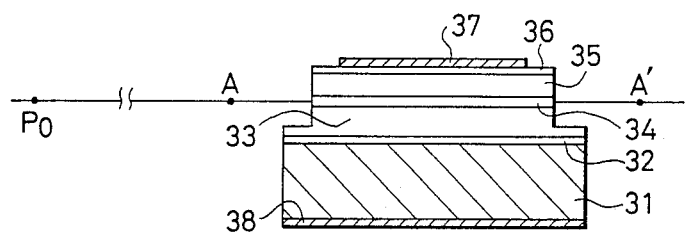
FIG. 6 is a cross-sectional view taken along line A—A' in FIG. 5.

FIG. 5 shows a second embodiment of the present invention, and FIG. 6 is a cross-sectional view taken along line A—A' of FIG. 5. The embodiment of FIG. 4 has a cross-sectional structure substantially similar to that of FIG. 6. The manufacturing process will hereinafter be described with reference to these Figures.

First, n type GaAs 32, n type AlGaAs 33, non-dope GaAs 34, P type AlGaAs 35 and P type GaAs 36 were grown on a wafer which is n type GaAs substrate 31, by the molecular line epitaxy method, whereafter a sector mask as shown in FIG. 4 or 5 was formed and was vertically processed in a mixed gas atmosphere of Ar and Cl$_2$ by the reactive ion etching method, whereby it was dug down to the intermediate portion of the n type AlGaAs 33 layer. The photomask pattern is formed by vertically and horizontally repeating the sector as shown in FIG. 4 or 5.

Subsequently, the entire surface was coated with an SiO$_2$ sputter film, portions 13a–13e or portions 23a–23c were removed by etching, and the surface was covered with a layered electrode 37 of Cr and Au. The electrode 37 was separated by the photolithography process so as to be capable of driving the portions 13a–13e or the portions 23a–23c independently. An alloy electrode 38 of Au and Ge was deposited by evaporation on the back surface and ohmicly joined thereto by heat diffusion, whereafter it was separated from each device by cleaving or cutting as shown in FIG. 4 or 5. The individual electrodes were taken out by wire bonding.

The case of FIG. 5 is an example in which the digging-down by dry etching was effected all around and an ohmic electrode was formed on the central portion. In this case, a good imaged state was obtained for L(Po)=10 mm, l=50 μm and $\theta = 0.5°$.

Figure 7A:
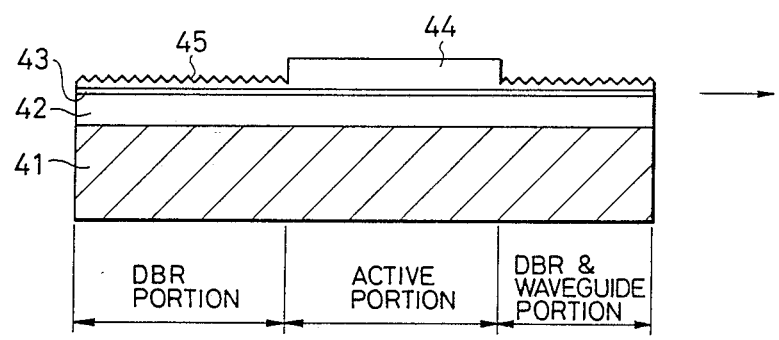
FIGS. 7A, 7B, 8A, 8B and 9 are schematic views showing third to fifth embodiments of the present invention.
Figure 7B:
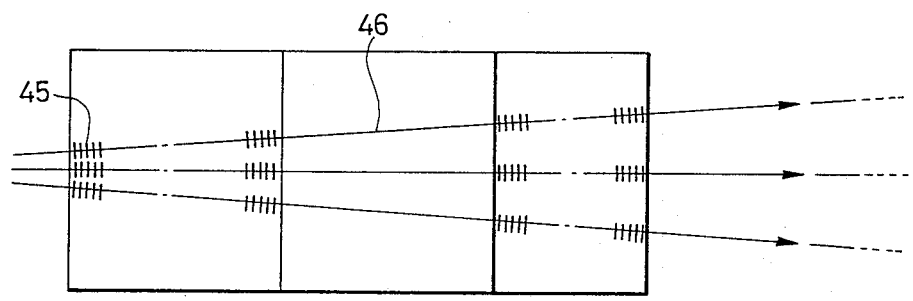

FIGS. 7A and 7B show a third embodiment of the present invention and are a cross-sectional view and a plan view, respectively, in a case where use is made of a DBR (distributed Bragg reflection) laser. Where a DBR laser is used, a plurality of laser beams emitted in different directions are obtained by radially forming diffraction gratings.

The method of making such DBR laser is similar to the method of an ordinary DBR laser, that is, a clad layer 42, an active layer 43 and a clad layer 44 are successively formed on a substrate 41.

Subsequently, the clad layer 44 forming the Bragg reflection (DBR) portion is removed to a thickness of several hundred nm by etching, and diffraction gratings 45 of a period of several hundred nm (see FIG. 7B) are radially formed thereon by interference exposure.

Finally, electrodes 46 for introducing a current are formed on the upper surface of the clad layer 44 corresponding to the active portion, along the directions in which the diffraction gratings 45 are formed. As regards the lengths of the various portions, the length of the DBR portion is several hundred μm to several μm, the length of the active portion is several hundred μm, and the length of the DBR and waveguide portion is several hundred μm.

Again in a case where a DFB (distributed feed back) laser is used, the intended purpose can be achieved by radially forming diffraction gratings in a substantially similar manner.

The foregoing description has been made with respect to a case where the light-emitting elements are arranged one-dimensionally so as to pass through a point Po, but again in a case where the light-emitting elements are arranged two-dimensionally, the intended purpose can be likewise achieved by arranging the directions of light emission so as to pass through a point Po. An example of it is shown in FIG. 8.

Figure 8A:
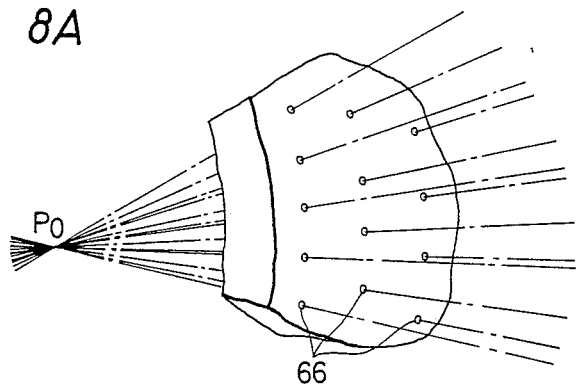
Figure 8B:
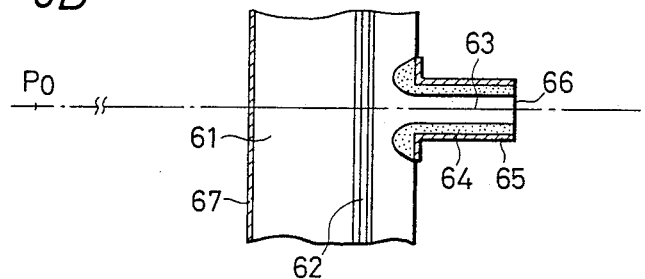

FIG. 8A is a perspective view showing a fourth embodiment of the present invention which constitutes a two-dimensional laser diode array, and FIG. 8B is a cross-sectional view of the individual laser portions, i.e., the light-emitting portions, shown in FIG. 8A.

A method of making such embodiment will hereinafter be described. First, a multilayer reflection film (layers of n type AlGaAs and n type GaAs) 62 was formed on an n type GaAs substrate 61, and n type AlGaAs and n type GaAs were further formed thereon, whereafter a projected portion 63 was formed by dry etching. Subsequently, P type areas 64 were provided by diffusion of Zn and a pn junction was formed. An electrode 65 for introducing a current was formed, whereafter it was thinned to about 70 μm by lapping. Reference numeral 66 designates the emitting end surfaces. Subsequently, an n type ohmic electrode 67 was formed on the back surface and the entire crystal was curved as shown in FIG. 8A. As a result, there was realized a two-dimensional array-like multibeam emitting device having different directions of emission.

Figure 9:
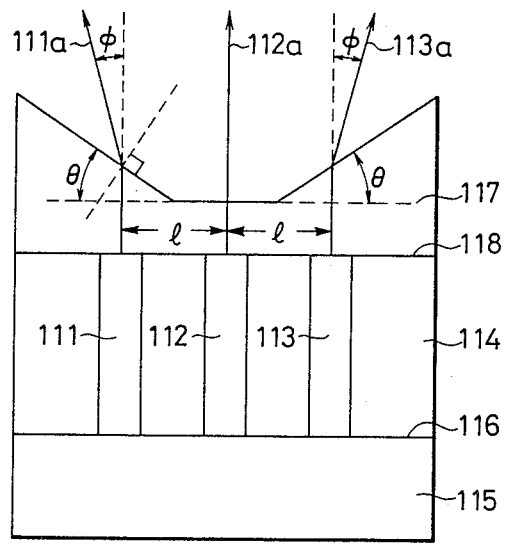

FIG. 9 schematically shows a fifth embodiment of the multibeam emitting device according to the present invention. In FIG. 9, reference numerals 111, 112 and 113 designate light-emitting elements emitting a laser beam. These elements together constitute a laser array 114. Reference numeral 115 denotes a coating (hereinafter referred to a the multilayer film reflection layer) for increasing the reflectance and protecting one end surface 116 of the laser array 114. In the present embodiment, a(amorphous)-Si and $SiO_2$ are used for the multilayer film reflection layer 115 so that the reflectance of the latter is 80%.

Reference numeral 117 designates a film of refractive index n (hereinafter referred to as the refractive layer). The refractive layer 117 is worked so as to have an inclination of angle $\theta$ at each of the opposite sides thereof. In FIG. 9, the angle is depicted exageratedly. This refractive layer 117 is a portion which provides the kernel of the present invention for protecting the other end surface 118 of the laser array 114 and controlling the reflectance thereof and at the same time providing a desired angle $\phi$ between the directions of light emission 111a, 112a and 113a. The directions of light emission 111a and 113a from the light-emitting elements 111 and 113, respectively, are outwardly bent by $\phi$ relative to the direction of light emission 112a from the light-emitting element 112, as shown. $\phi$ is given by $\sin(\theta+\phi)=n\cdot\sin\theta$ from the Snell's law. Accordingly, if it is desired to provide the angle $\phi$, $\theta$ may be determined from the above equation and working may be done. When both of $\phi$ and $\theta$ are very small, the above equation is approximately $(\theta+\phi)=n\theta$ and therefore, $\theta$ may be determined from $\theta=\phi/(n-1)$. In the present embodiment, $\phi=5°$, $n=1.5$ and $\theta=10°$. The substance used for the refractive layer 117 may be any substance which may be well joined to the laser array 114 and which is great in electrical resistance. The refractive index n is selected so that the refractive layer has a desired reflectance of light for the semiconductor used for the active layer. Generally, if n is approximate to 1, it will be more convenient in that the reflection with the air surface is small and the reflectance of the active layer does not become too low. So, in the present embodiment, $SiO_2$ is chosen. The refractice index n of $SiO_2$ is n≈1.5 and therefore, the reflectance with the air is of the order of several %.

In the present embodiment, the interval between the light-emitting elements 111–113, namely, the array interval l, is 20 μm, but may alternatively be 50 μm or 100 μm. In this latter case, to maintain $\theta$ in the order of 10°, only several μm of the light-emitting elements 111 and 113 near the fore ends thereof may be inclined and the remaining portion may be made parallel to the end surface 118.

Figure 10A:
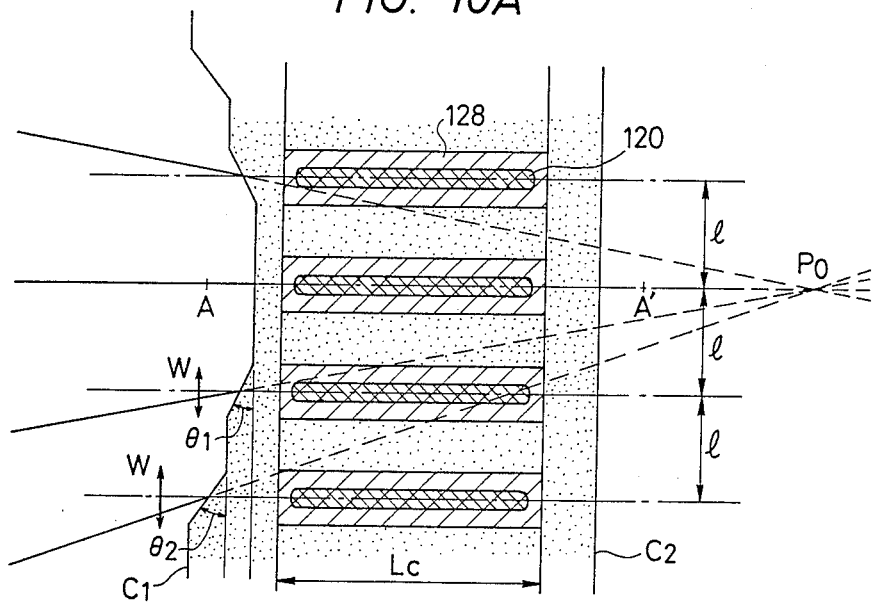
FIGS. 10A, 10B and 11 are schematic views showing modifications of the fifth embodiment.
Figure 10B:
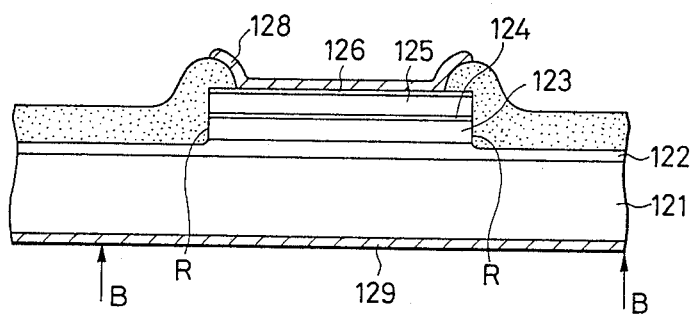

The present embodiment will now be described in greater detail with reference to FIGS. 10A and 10B. FIGS. 10A and 10B show an example in which the refractive layer is worked with two different angles of inclination $\theta_1$ and $\theta_2$, but are entirely the same as FIG. 9 in principle. The manufacturing process will hereinafter be described.

First, an n type GaAs layer 122 of a thickness of 1 μm, an n type AlGaAs layer 123 of a thickness of 2 μm, a non-dope GaAs layer 124 of a thickness of 0.1 μm, a P type AlGaAs layer 125 of a thickness of 1 μm and an n⁺ GaAs layer 126 of a thickness of 0.15 μm were successively grown on an n type GaAs substrate 121 by the molecular line epitaxy method.

Subsequently, a resonance surface R was vertically processed by the use of an ion beam and dug down to the intermediate portion of the n type GaAs layer 122.

Then, $SiO_2$ was formed to a thickness of 4 μm by the high frequency sputtering, whereafter this $SiO_2$ was dry-etched to the n⁺GaAs layer 126 to form a current introducing portion 120. Further, in an area limited by $C_1$ and $C_2$, the $SiO_2$ film was vertically processed by the ion beam process with Cr as a mask and was dug down to the n type GaAs layer 122. Subsequently, Cr-Au was deposited by evaporation as an ohmic electrode 128 while the end surface was protected by photoresist (AZ-1350J), and as shown in FIG. 10A, the etching for separation was effected to leave only that portion of $SiO_2$ which was near the current introducing portion 120.

Finally, an ohmic electrode 129 for n type was formed on the back surface and heat-treated, whereafter it was scribed at positions indicated by B in FIG. 10B. The two positions B shown in FIG. 10B show the same repetition points, and the actual pattern is repeated at this period.

As regards the dimensions of the various portions, the cavity length Lc is 300 μm, the pitch l is 50 μm, the angles of inclination $\theta_1$ and $\theta_2$ are about 7° and about 15°, respectively, and the length W is about 20 μm. The respective directions of light emission were deflected as if all of them were emitted from a point Po.

Figure 11:
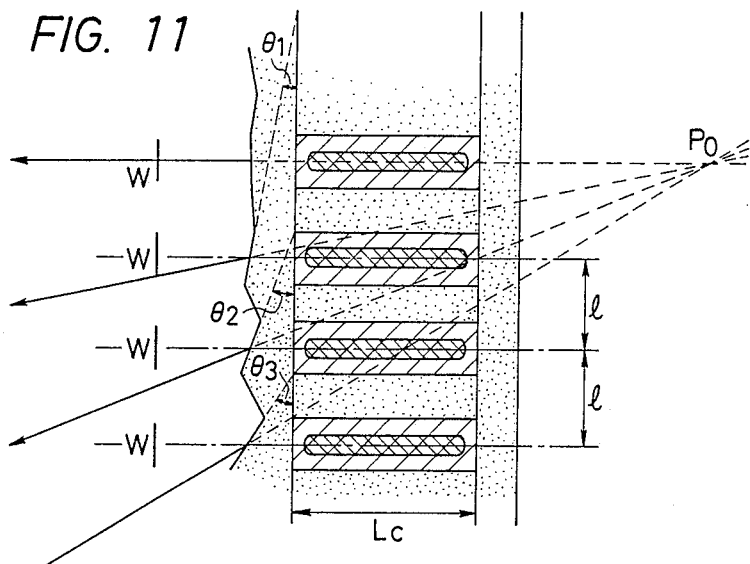

FIG. 11 shows a modification of the previous embodiment and corresponds to FIG. 10A. A feature of this modification is that the shape of the surface of the refractive layer is varied so that the distance between the resonance surface and the refracting surface is the same relative to each emitted light.

An example of the method of making a semiconductor device of such structure (particularly the device shown in FIG. 9) will now be described with reference to FIGS. 12A, 13 and 14.

Figure 12A:
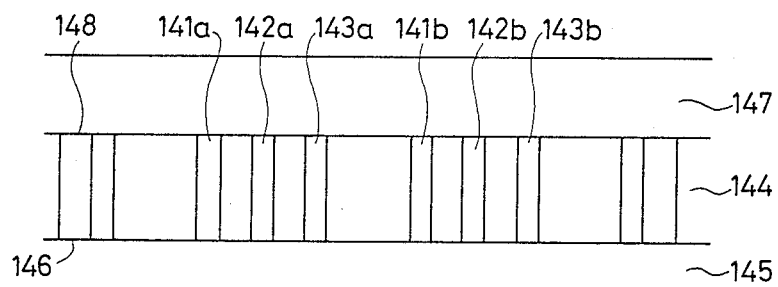
FIGS. 12A, 12B, 13 and 14 illustrate the process of making the fifth embodiment.

First, in FIG. 12A, a laser array portion 144 including plural sets of light-emitting elements 141a, 142a, 143a; 141b, 142b, 143b; . . . is made by the method described, for example, in Takeshi Ikeda: OPTRONICS 9 (1984) 64. Subsequently, the laser array portion is coated with a multilayer film reflection layer 145 formed of a-Si and $SiO_2$, and then is coated with a refractive layer 147 of a thickness of several μm formed of $SiO_2$. Reference numerals 146 and 148 designate the opposite end surfaces of the laser array portion 144.

Figure 12B:
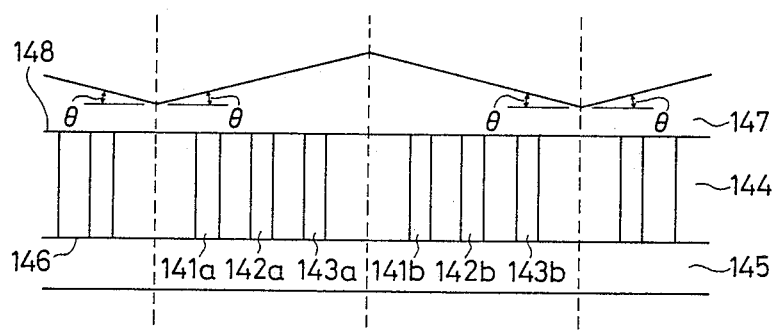
Figure 13:
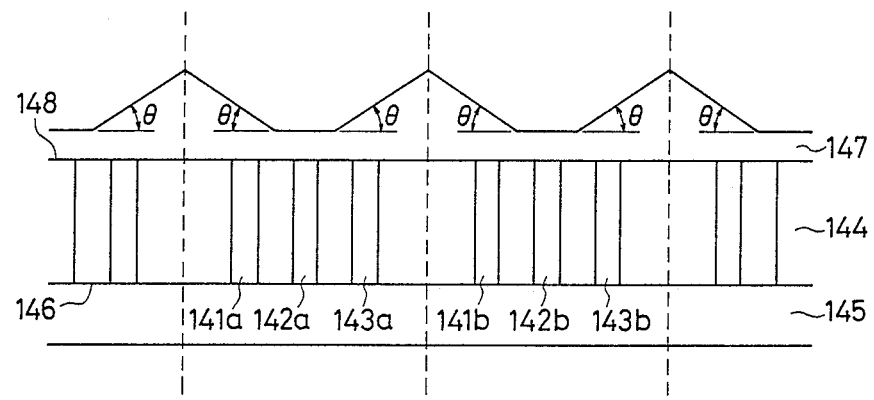

Subsequently, as shown in FIG. 13, inclined surfaces each having an angle $\theta$ are worked on the surface of the refractive layer 147. This working may be accomplished by the dry etching process (the ion beam working) with a mask having a cross-section of a desired surface shape as shown in FIG. 14 being applied to the surface of the refractive layer 147. In FIG. 14, reference numeral 161 designates the entire device shown in FIG. 12, reference numeral 162 denotes a mask for ion beams, and reference numeral 163 designates the direction of incidence of ions.

Figure 14:
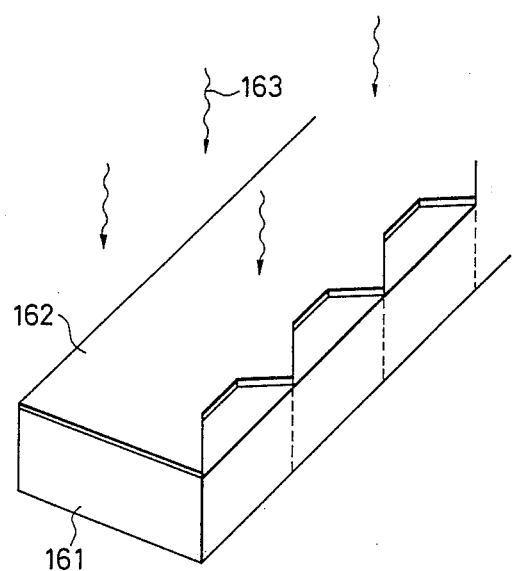

Finally, the device is cut along dotted lines indicated in FIG. 14, whereby the device is completed.

Further modifications of the previous embodiment will now be described.

Figure 15:
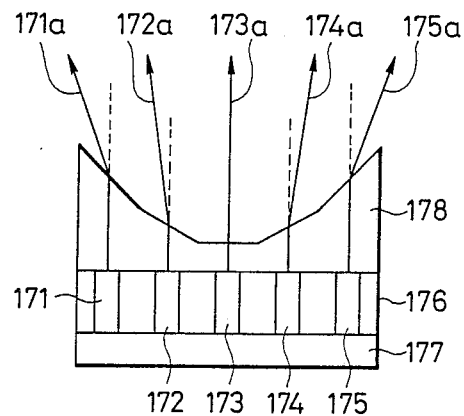
FIGS. 15, 16, 17, 18 and 19 illustrate further modifications of the fifth embodiment.

(I) In the previously described embodiment, a device from which light is emitted in three directions has been shown, but the number of the directions of light emission may be arbitrary and for example, if the design as shown in FIG. 15 is adopted, light can be emitted in five directions. In this example, a refractive layer 178 is worked into a concave shape. Reference numerals 171-175 designate light-emitting elements, reference numeral 176 denotes a laser array portion, reference numeral 177 designates a multilayer reflection layer, and reference characters 171a-175a denote the directions of light emission from the light-emitting elements 171-175.

Figures 16A, 16B:
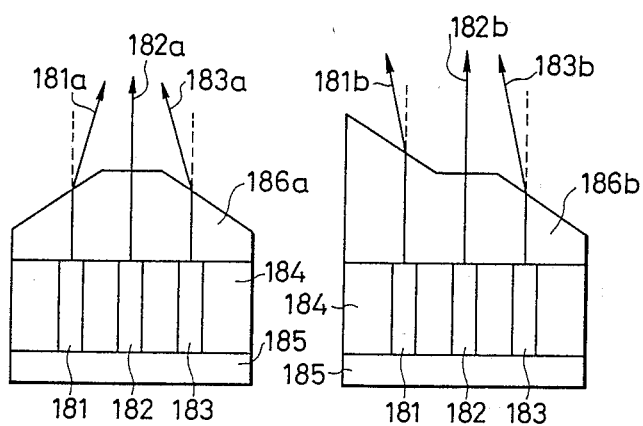

(II) In the previously described embodiment, the refractive layer is worked into a concave shape, but a similar effect may be obtained even if the refractive layer is worked into a convex shape or other shape as shown in FIG. 16A or 16B. Reference numerals 181-183 designate light-emitting elements, reference numeral 184 denotes a laser array portion, reference numeral 185 designates a multilayer reflection layer, reference characters 186a and 186b denote refractive layers, and reference characters 181a-183a and 181b-183b designate the directions of light emission.

(III) In the previously described embodiment, beams are emitted in different directions, but a single beam is emitted in each of the directions. However, a laser from which a plurality of beams are emitted in each direction can be made in the following manner. Thereby, the power of the emitted beams per direction is increased.
  (i) In FIG. 13, cutting the device along the dotted lines is abandoned.
  (ii) The refractive layer is worked as shown in FIG. 12B.

(IV) The light-emitting elements may be, for example, light-emitting diodes instead of laser diodes.

Figure 17:
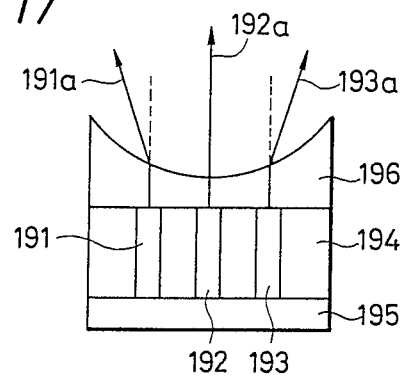

(V) The shape of the refractive layer need not be provided with a level difference, but a similar effect may be obtained even if the shape of the refractive layer is gradually varied continuously as shown, for example, in FIG. 17. Reference numerals 191-193 designate light-emitting elements, reference numeral 194 denotes a laser array portion, reference numeral 195 designates a multilayer reflection layer, reference numeral 196 denotes a refractive layer, and reference characters 191a-193a designate the directions of light emission.

Figure 18:
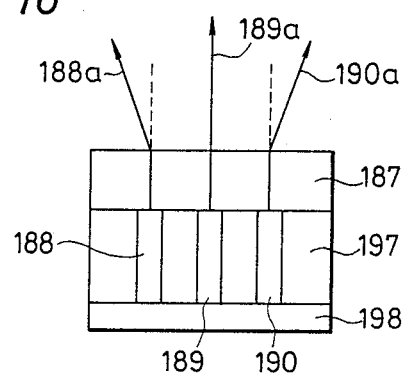
Figure 19:
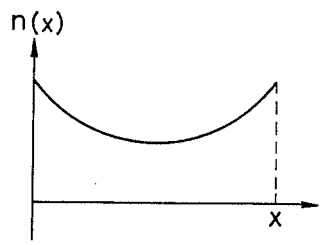

(VI) The surface of the refractive layer need not always be provided with a change in shape, but a similar effect may be obtained even if the shape of the refractive layer 187 is flattened as shown, for example, in FIG. 18 and the refractive index n of the refractive layer 187 is spatially varied as shown in FIG. 19. Reference numerals 188-190 designate light-emitting elements, reference numeral 197 denotes a laser array portion, reference numeral 198 designates a multilayer reflection layer, and reference characters 188a-190a denote the directions of light emission.

(VII) A similar effect may be obtained even if both of the shape and the refractive index of the refractive layer are spatially varied.

Figure 20:
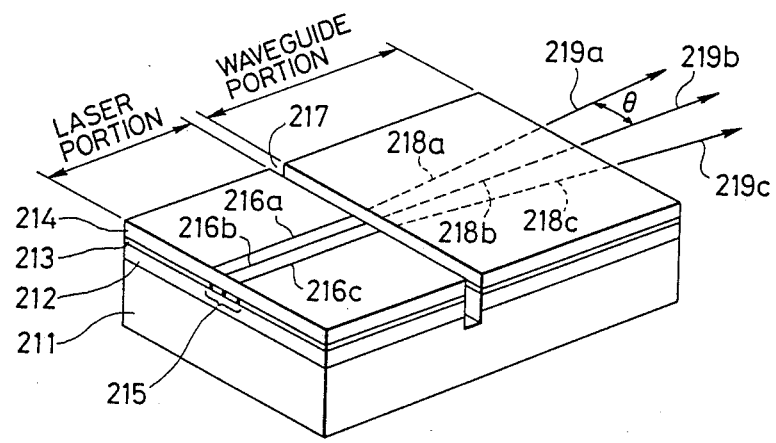
FIG. 20 is a perspective view showing a sixth embodiment of the present invention.

FIG. 20 shows a sixth embodiment of the present invention which uses a thin film waveguide, and more particularly a planer structure. The process of manufacturing such embodiment will hereinafter be described.

First, an ordinary double hetero structure, i.e., a clad layer 212, an active layer 213 and a clad layer 214, are grown on a substrate 211.

Subsequently, in the waveguide portion, waveguides 218a, 218b and 218c are formed so that they are endowed with a difference in refractive index from the other portion than the waveguides by the ordinary photolithography process and diffusion of impurities and moreover straightly form a certain angle $\theta$. In this case, the refractive index must be endowed with a variation in the surface parallel to the active layer 213. Subsequently, electrodes 216a, 216b and 216c are formed on the clad layer 214 of the laser portion correspondingly to the waveguides 218a, 218b and 218c, respectively. The time relation between the formation of these electrodes and the formation of the waveguide portion need be changed in conformity with the heat treatment temperatures of the respective steps.

Subsequently, a groove 217 for separating the waveguide portion and the laser portion from each other is formed to the vicinity of the boundary between the substrate 211 and the clad layer 212 by etching. One of the resonator mirrors of the laser portion is provided by the wall surface of this groove 217 which is adjacent to the laser portion, and the other of the resonator mirrors can be provided by utilizing the cleaved surface of an ordinary semiconductor (in the case of FIG. 20, the vicinity of the end surface opposite to the groove 217 which is adjacent to the laser array portion 215).

Reference characters 219a, 219b and 219c designate the directions of light emission. As regards the dimensions of the components shown in FIG. 20, the thicknesses of the clad layers 212 and 214 are about 2 $\mu$m, the thickness of the active layer 213 is about 0.1 $\mu$m, the stripe width of the laser array portion 215 is several $\mu$m, the pitch thereof is about 100 $\mu$m, the cavity length (the length of the laser portion) is about 300 $\mu$m, the width of the groove 217 is 1-2 $\mu$m, the depth thereof is 3-5 $\mu$m, the length of the waveguide portion is several hundred $\mu$m, the width of the waveguides 218a-218c is several $\mu$m, and the angle of divergence $\theta$ of the directions of light emission 219a-219c is several degrees.

In the embodiment shown in FIG. 20, each of the waveguides 218a-218c is straightly formed with a certain angle $\theta$, whereas the formation of these waveguides is not restricted to straight lines. That is, the waveguides may be formed so that light diverges radially at the point of time whereat finally the light is emitted from the waveguides, and for example, waveguides bent as shown in FIG. 21 are also possible.

Figure 21:
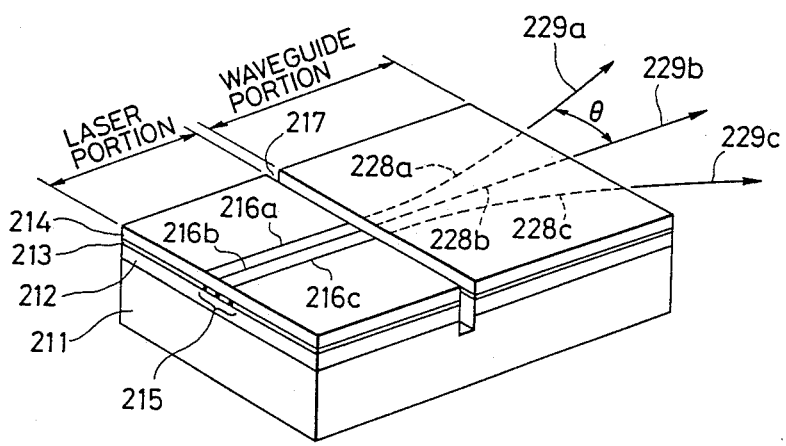
FIGS. 21, 22A, 22B, 23A and 23B are schematic views showing modifications of sixth embodiment.

FIG. 21 shows a modification of the previously described embodiment. The waveguides 228a-228c indicated by broken lines are straight near the groove 217, but are gradually bent radially toward the end surface from which the light is emitted.

In these devices, three parallel laser beams are obtained when the laser array portion 215 is oscillated by the introduction of a current thereinto. These parallel beams pass through the groove 217 into the radial waveguides 218a-218c or 228a-228c and are taken out as radial laser beams.

In the foregoing description, as the method of forming the waveguide portion, a difference in refractive index has been provided between the waveguides and the other portion than the waveguides by diffusion of impurities, but besides this, the variation in refractive index by ion introduction or disordering of the supergrating structure can also be utilized.

Also, FIG. 20 shows the planer structure, but where a buried hetero (BH) structure laser is used as the laser portion, confinement of light in the waveguide portion can be accomplished more effectively. That is, if in the process of making a laser diode, etching is effected with the active area of the laser portion left and at the same time, the portions to be used as waveguides are left and the light confining portion of each light-emitting element and the light confining portion of the waveguide portion are completed by buried growth, confinement of light in the waveguide portion will become very effective.

Where use is made of the laser having the Fabry Perot resonator as shown in FIGS. 20 and 21, the laser light is passed through the air (corresponding to the groove 217) to form a resonator, whereafter it is directed into the waveguides. Therefore, the widening of the laser light or the reflection of the light on the end surface of the waveguides which is adjacent to the groove 217 may occur to decrease the rate of the light entering the waveguides or cause cross-talk to take place.

As a countermeasure for this, the groove 217 may be filled with a substance of great refractive index. In this case, the magnitude of the refractive index is chosen to a value smaller than the magnitude of the refractive index of the other portion than the waveguides 218a–218c or 228a 228c in the aforedescribed waveguide portion.

Figure 22A:
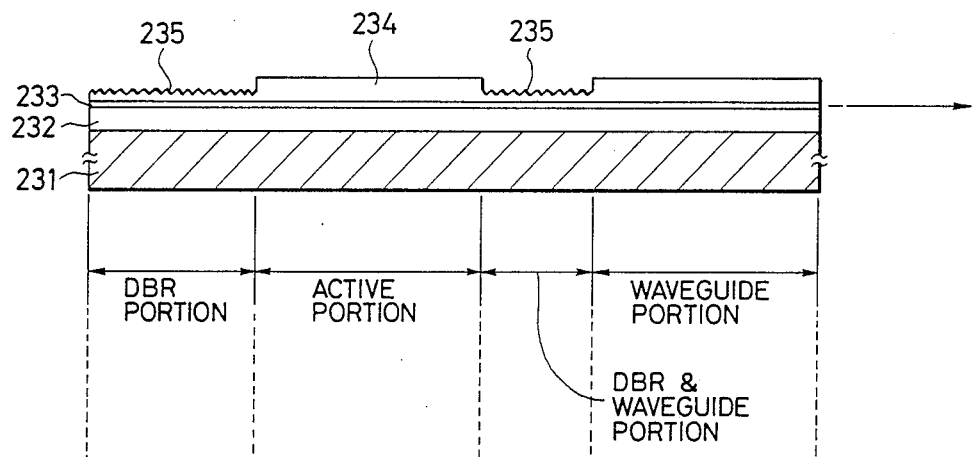
Figure 22B:
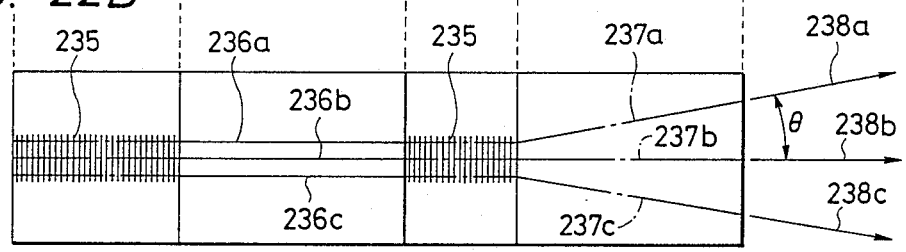

FIGS. 22A and 22B are a cross-sectional view and a plan view, respectively, showing a modification of the sixth embodiment using a DBR (distributed Bragg reflection) laser.

First, a clad layer 232, an active layer 233 and a clad layer 234 are successively formed on a substrate 231.

Subsequently, the clad layer 234 corresponding to the Bragg reflection (DBR) portion and the DBR and waveguide portion is removed to a thickness of several hundred nm by etching, and diffraction gratings 235 of a period of several hundred nm are formed thereon by interference exposure. Further, electrodes 236a, 236b and 236c are formed on the upper surface of the clad layer 234 corresponding to the active portion.

Finally, in the waveguide portion, waveguides 237a, 237b and 237c are formed in a surface parallel to the active layer 233. In this case, the shape of the waveguides may be straight or radial, but in any case, the waveguides need be formed so that light is emitted at a certain angle $\theta$ at the point of time whereat the light is emitted.

Where such a DBR laser is used, the medium along which the laser light is transmitted does not change in the laser portion and the waveguide portion, and this leads to an advantage that widening of the laser light or reflection of the light on the end surface of the waveguides hardly takes place.

A similar effect can be expected where a DFB (distributed feed back) laser is used.

Figure 23A:
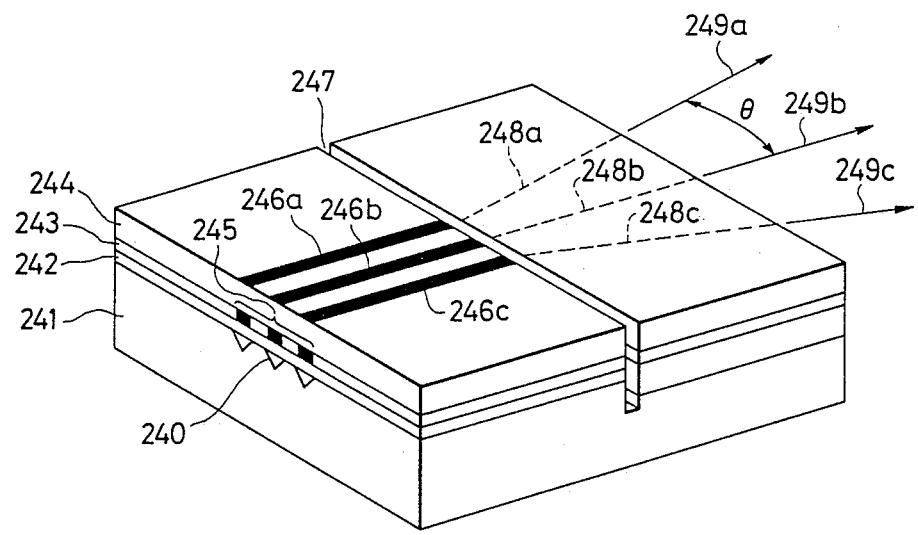
Figure 23B:
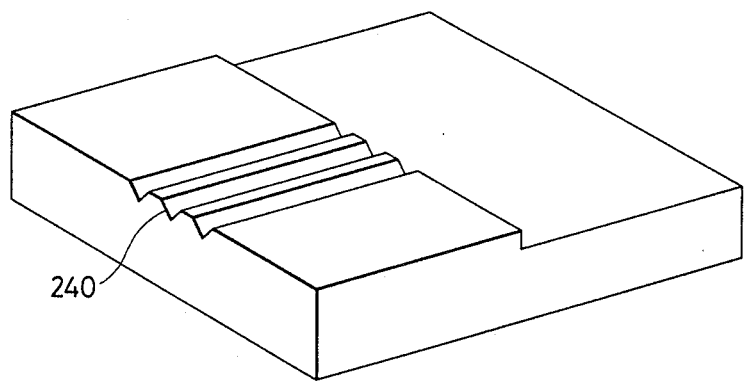

FIGS. 23A and 23B show a modification of the sixth embodiment. This modification is almost similar in construction to the modification of FIG. 20 or 21 and therefore need not be described. A feature of this modification is that, as shown in FIG. 23B, V-shaped grooves 240 are provided in the laser portion of a substrate 241 correspondingly to the positions of laser arrays 245. In the process of growing a clad layer 242, an active layer 243 and a clad layer 244 on the substrate 241, these grooves 240 can contribute to enhancing the refractive index of the vicinity of this area, thereby improving the light emitting characteristic of the laser.

Figure 24:
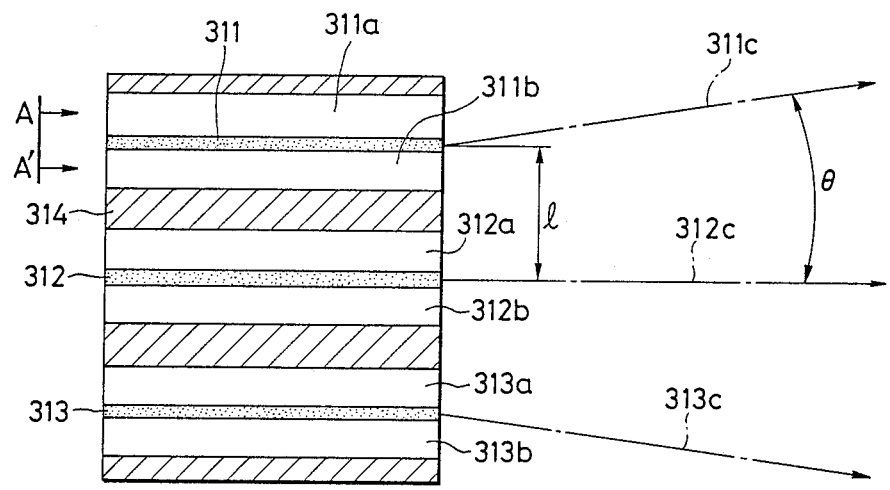
FIGS. 24 and 25 are schematic views showing a seventh embodiment of the present invention.

FIG. 24 shows a seventh embodiment of the present invention, and more particularly shows an array of monothically formed three laser light-emitting elements 311, 312 and 313. Pairs of electrodes 311a and 311b, 312a and 312b, and 313a and 313b are disposed at the opposite sides of the respective elements 311, 312 and 313. Reference numeral 314 designates boundary areas in which the insulation between the electrodes of the different elements (for example, between the electrodes 311b and 312a or 312b and 313a) is kept. Also, l denotes the array interval, and reference characters 311c, 312c and 313c designate the directions of light emission from lasers 311, 312 and 313, respectively.

By making the currents introduced into the respective electrodes of each pair of electrodes 311a and 311b, 312a and 312b, 313a and 313b differ from one another, the directions of light emission from the array lasers 311, 312 and 313 can be deflected by an angle $\theta$ as shown in FIG. 24. For example, by making the current introduced into the electrode 311a greater than the current introduced into the electrode 311b, the direction of light emission 311c is inclined with respect to the direction 312c perpendicular to the end surface of the elements, as shown in FIG. 24.

Figure 25:
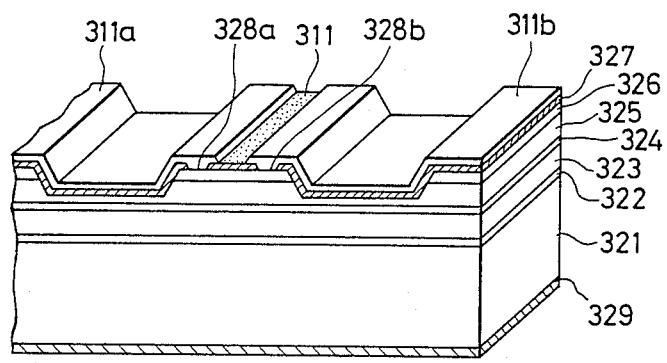

FIG. 25 is a cross-sectional view of the individual lasers 311, 312 and 313 of FIG. 24 taken along line A—A' of FIG. 24. The manufacturing process will hereinafter be described with reference to this Figure.

First, an n type GaAs layer 322 as a buffer layer and an n type AlxGa1-xAs layer 323 as a clad layer are formed on an n type GaAs substrate 321. Where the molecular line epitaxy method is used, Si is used as an n type dopant. Subsequently, a non-dope GaAs layer 324 as an active layer, a P type (Be dope) AlxGa1-xAs layer 325 and a P type GaAs layer 326 are grown, whereafter the layer 326 is scraped off to the vicinity of the non-dope GaAs layer 324 by etching. Reference numeral 327 designates an insulating film constituted by an $SiO_2$ film or the like, and the area into which a current is introduced is limited to portions 328a and 328b by this insulating film. Generally, the interval between the portions 328a and 328b is several $\mu$m. In FIG. 25, reference numeral 329 designates an electrode.

The array interval l (see FIG. 24) of the semiconductor lasers in the present invention is 100 $\mu$m, and the directions of emission between the arrays can be varied by $\theta = 2°$ each by making the currents introduced into the pair of electrodes 311a and 311b differ from each other.

It is difficult to continuously deflect the angle of light deflection $\theta$ of FIG. 24 over a wide range of $\pm 10°$, for example, and therefore it is preferable to use such angle $\theta$ in combination with the construction of the first embodiment, for example.

Figure 26:
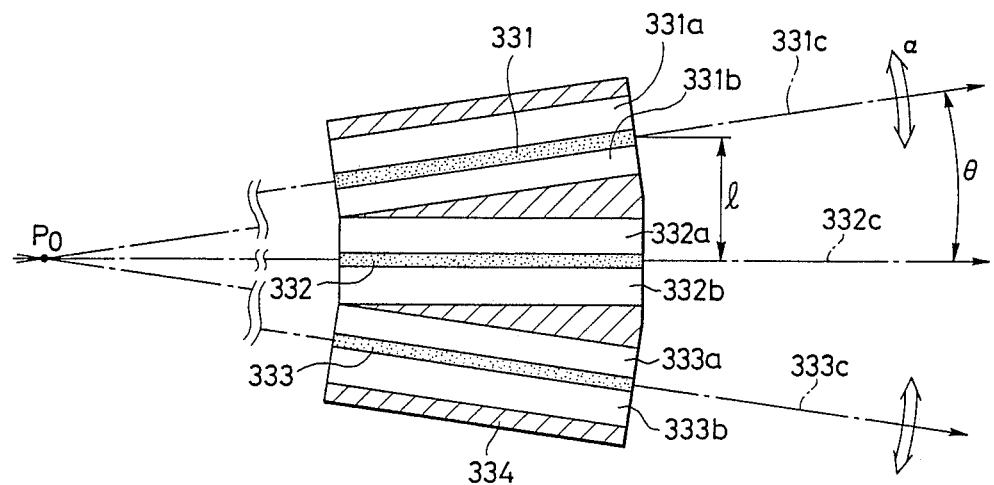
FIGS. 26 and 27 are schematic views showing a modification of the seventh embodiment.

FIG. 26 shows an example of it, that is, a modification of the seventh embodiment. First, the resonance surfaces of light-emitting elements 331, 332 and 333 are pre-worked so as to have a predetermined angle $\theta$, and a minute angle $\alpha$ is controlled by making the currents introduced into pairs of electrodes 331a and 331b, 332a and 332b, 333a and 333b differ from one another.

In this case, the cross-sections of individual lasers 331, 332 and 333 have the structure as shown in FIG. 25, as in the embodiment shown in FIG. 24.

The construction of FIG. 26 is very advantageous in changing and setting the directions of emission from three or more light-emitting elements, because (I) the angle $\theta$ is determined by the process of the photomask using the photolithography process or the like and therefore, as shown in FIG. 24, there are no limits (upper and lower limits) in the value of the angle of deflection, and (II) fine adjustment of the angle $\alpha$ can be effected while the imaging state of the scanning optical system is seen.

Figure 27:
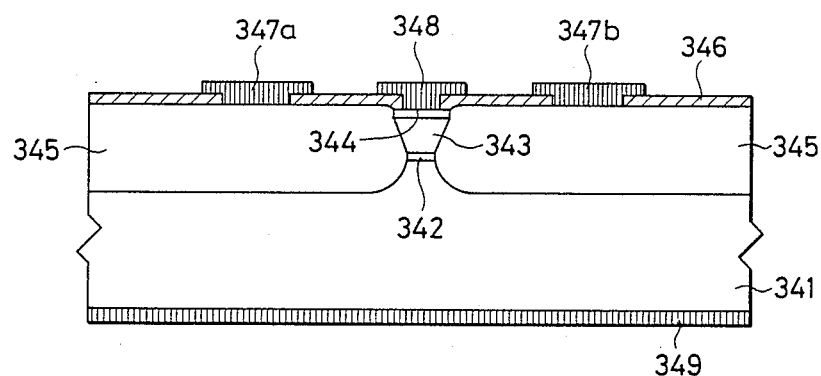

FIG. 27 is a cross-sectional view showing an example in which the light-emitting elements in the seventh embodiment are formed into a so-called hetero bipolar type. The manufacturing process will hereinafter be described.

First, a P type InGaAsP laser 342, an n type InP layer 343 and an n type InGaAsP layer 344 were successively formed on an n type InP substrate 341 by the liquid phase epitaxy method, and a metha structure was formed by chemical etching, whereafter it was buried in a P$^{+InP}$ layer 345 also by the liquid phase epitaxy method. Further, an SiO$_2$ insulating film 346 was formed, whereafter Au-Sn electrodes 348 and 349 and Au-Zn electrodes 347a and 347b were formed.

By independently controlling the current introduced into the electrodes 347a and 347b, the directions of light emission from the lasers can be deflected by an angle $\alpha$.

The means for deflection by the angle $\alpha$ need not be provided in all of the individual lasers constituting the array. Also, the angle of difference $\theta$ between the preset directions of light emission usually shifts by predetermined value, but may assume different values such as $\theta_1, \theta_2, \theta_3, \ldots$ as required.

Figure 28:
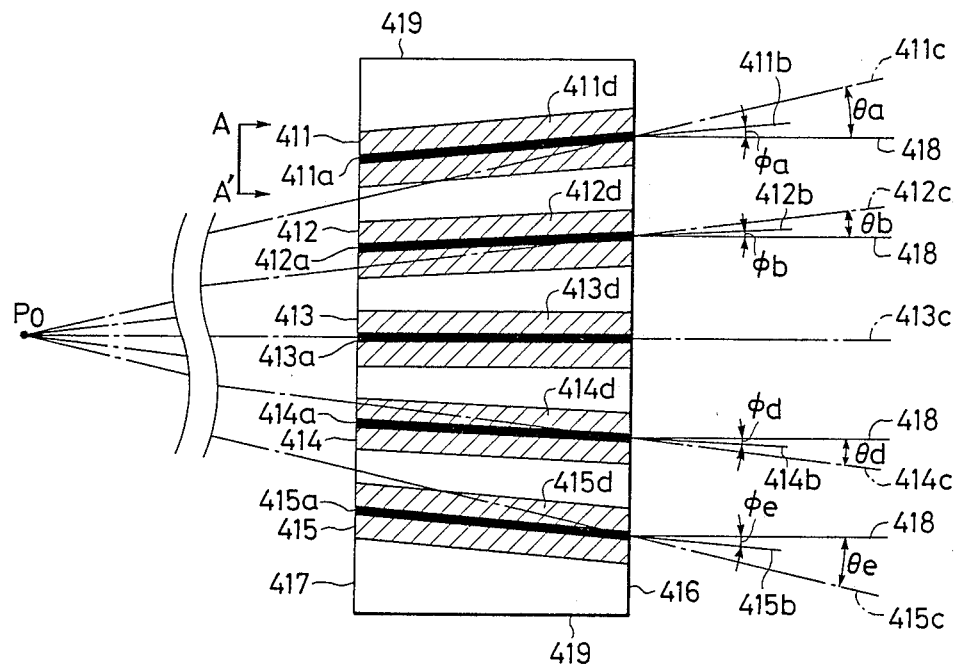
FIGS. 28 and 29 are schematic views showing an eighth embodiment of the present invention.

FIG. 28 shows an eighth embodiment of the present invention. In FIG. 28, reference numerals 411–415 designate individual semiconductor laser elements, and reference characters 411a–415a correspond to the areas in the semiconductor laser elements 411–415 into which a current is introduced, i.e., light-emitting areas. The angles formed by the extensions (hereinafter referred to as the resonance directions) 411b–415b of the areas 411a–415a with normals 418 to resonance surfaces 416 and 417 are $\phi$a, $\phi$b, $\phi$c, $\phi$d and $\phi$e, respectively.

The resonance surfaces 416 and 417 are parallel to each other since the cleaved surfaces of crystal (e.g. GaAs) usually used as the substrate are utilized as such resonance surfaces, but where the degree of parallelism may somewhat differ as in the case of dry etching, the resonance surface 416 on the front emitting side of the lasers is considered to be the reference.

The light resonated by the resonance surfaces 416 and 417 is bent substantially in accordance with Snell's law when it is emitted from the resonance surface 416. In FIG. 28, reference characters 411c–415c designate the directions of light emission.

Here, if the angle formed by any direction of light emission with the normal 418, that is, the angle of emergence, is $\theta$, there is established the relation that $\eta/\eta_0 = \sin\theta/\sin\phi$. Assuming, for example, a case where light is emitted from GaAs crystal, the laser light emerges at about 3.5° with respect to the normal 418 if $\phi$ is chosen to 1°, because $\eta$(the refractive index of the crystal) is about 3.5 and $\eta_0$(the refractive index of air) is about 1.

In the embodiment shown in FIG. 28, it has been possible to make a multibeam emitting device in which the angles of emergence $\theta$a, $\theta$b, $\theta$c, $\theta$d, and $\theta$e are +3.5°, +1.75°, 0.0°, −1.75° and −3.5°, respectively, by setting $\phi$a, $\phi$b, $\phi$c, $\phi$d and $\phi$e to +1.0°, +0.5°, 0.0°, −0.5° and −1.0°, respectively.

Figure 29:
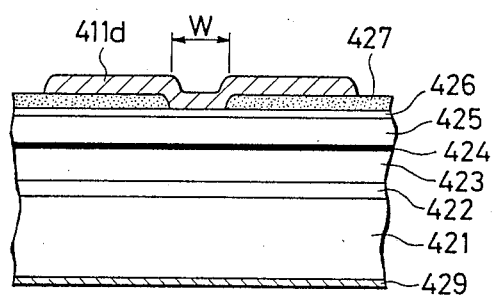

FIG. 29 is a cross-sectional view taken along line A—A' of FIG. 28. The manufacturing process will hereinafter be described in detail by reference to this Figure.

First, an n type GaAs layer 422 of a thickness of 1 μm as a buffer layer, an n type AlGaAs layer 423 of a thickness of 2 μm as a clad layer, a non-dope GaAs layer 424 of a thickness of 0.08 μm as an active layer, a P type AlGaAs layer 425 of a thickness of 1.5 μm as a clad layer and a P+.GaAs layer 426 of a thickness of 0.1 μm as a cap layer were successively formed on an n type GaAs substrate 421 by the molecular line epitaxy method.

Subsequently, a silicon nitride film 427 of a thickness of 0.2 μm was layered by the plasma CVD method to limit the area into which a current is introduced, whereafter a part of the silicon nitride film (the areas 411a–415a of FIG. 28) was removed by the photolithography process. The stripe width (the width W of the area into which a current is introduced) is 5 μm. Also, five stripes are formed at an angle of 0.5°.

Subsequently, a Cr-Au ohmic electrode was formed as an upper electrode, and was separated into five independent electrodes 411d–415d.

Also, the GaAs substrate 421 was planed to a thickness of 100 μm by lapping, whereafter an Au-Ge electrode as an ohmic electrode 429 for n type was deposited by evaporation.

Subsequently, a heat treatment for diffusion was carried out, whereafter the resonance surfaces 416 and 417 were cleaved as shown in FIG. 28. The surface 419 was separated by scribe The pitch of each laser is 100 μm on the resonance surface 416. On the other hand, the respective electrodes 411d–415d were independently taken out by wire bonding (not shown). The cavity length (the interval between the resonance surfaces 416 and 417) is 300 μm.

Thus, five laser elements whose directions of light emission differ from one another by 1.75° each in the same plane could be monolithically formed. As regards said angle $\phi$, if it is selected to a too great value, the angle of incidence onto the resonance surfaces will become great and the reflectance will be reduced and therefore, the angle $\phi$ may suitably be within ±15°. Particularly, up to the angle $\phi$ of about ±3°, the increase in the oscillation threshold value current is of the order of 10–20% and this is easy in driving. Moreover, the angle of emergence $\theta$ of light can be changed up to the order of ±10°.

The present embodiment has been described with respect to a stripe electrode type laser (a kind of gain waveguide type laser) using a GaAs system, but the present invention is also applicable to other gain waveguide type laser such as a proton bombard type laser and is also effective for a refractive index waveguide type laser of BH structure, ridge wave structure or the like.

In the above-described embodiments, there has been shown a multibeam emitting device formed so that the lights from a plurality of semiconductive light-emitting elements emerge in different directions as if they were emitted from a point Po, but by further providing near the point Po a photodetector for detecting the light emerging from the end surface opposite to the light-emitting end surface of the light-emitting elements, the output control of the multibeam emitting device can be efficiently accomplished by a simple construction. An example of it will hereinafter be described.

FIGS. 30 to 33 show a ninth embodiment of the multibeam emitting device according to the present invention.

In FIG. 30, laser elements 431, 432, 433 and a photodetector 434 are monolithically formed on a substrate 435. The light-emitting end surfaces 431a, 432a and 433a (or 431b, 432b and 433b) of the laser elements 431, 432 and 433, respectively, lie on the same circumference, and the light-receiving surface of the photodetector 434 lies at the point of intersection P between the directions of light emission 431c, 432c and 433c from the laser elements 431, 432 and 433. Further, the film constructions of the laser elements 431, 432, 433 and photodetector 434 are entirely identical to each other and the electrical couplings thereof are reversely formed, and these elements and the photodetector function as light-emitting elements and a detecting element, respectively.

The light-emitting end surfaces 431a, 432a and 433a of the thus formed laser elements 431, 432 and 433 and the light-receiving surface of the photodetector 434 were subjected to the etching by a reactive ion beam and were finally subjected to chemical etching. In the present embodiment, a sufuric acid-hydrogen peroxide system was used as the chemical etching liquid.

The manufacturing process will now be described.

Referring to FIG. 31, an n type GaAs buffer layer 441 of a thickness of 1.5 $\mu$m, an n type GaAlAs clad layer 442 of a thickness of 1 $\mu$m, a non-dope GaAs active layer 443 of a thickness of 0.5 $\mu$m, a P type GaAlAs clad layer 444 of a thickness of 1 $\mu$m and a P type GaAs cap layer 445 of a thickness of 0.5 $\mu$m were successively formed on an n type GaAs substrate 435.

Subsequently, on the thus formed crystal of double hetero structure, mask formation is effected by the photolithography process so that a desired shape is obtained.

The then mask pattern is made so that the directions of light emission 431c, 432c and 433c of the laser elements are shifted by 1.3° each and that the photodetector 434 can be constructed at the point of intersection P between the directions of light emission.

The thus formed crystal was removed up to the surface of the substrate 435 by reactive ion beam etching to thereby obtain the shape as shown in FIGS. 30 and 32.

FIG. 33 is a plan view corresponding to FIG. 30 and showing the positional relations between the three laser elements 431–433 and the photodetector 434. The photodetector 434 is constructed at the point of intersection P between the directions of light emission 431c, 432c and 433c from the laser elements 431, 432 and 433 as described above and therefore, it has become possible to efficiently receive the lights from the laser elements 431, 432 and 433 by the single photodetector 434. Therefore, it has become possible to control the quantities of light of the individual laser elements 431, 432 and 433 at higher accuracy.

The method of driving the laser elements will now be described by reference to FIG. 33.

First, the electrodes 431d, 432d and 433d of the laser elements 431, 432 and 433, respectively, are independently driven. The lights cannot be monitored at a time and therefore, the laser elements are time-serially driven and the quantities of light of the laser elements 431, 432 and 433 are stabilized by being compared with the reference value. The operation for this stabilization is effected, for example, during a blank time irrelative to image recording.

Also, in the case of a construction in which the optic axis beams for which the intensities of the radiation beams from the laser elements become maximum return to the light-emitting end surfaces 431a, 432a and 433a in the positional relations between the laser elements 431, 432, 433 and the photodetector 434, self-coupling of the laser elements 431, 432 and 433 occurs and instability of the characteristic thereof is caused. Therefore, such a construction in which the light beams do not return to the light-emitting end surfaces 431a, 432a and 433a of the laser elements 431, 432 and 433 becomes necessary. That is, if the light-receiving surface of the photodetector 434, i.e., the reflecting surface for the incident beam, is inclined at any suitable angle, the quantities of the lights returning to the light-emitting end surfaces will become very small and the instability of the characteristic of the laser elements can be eliminated.

As regards the direction of the light-receiving surface of the photodetector 434, it may be of any of the following constructions:

(1) a construction in which said direction is arbitrarily rotated in the direction of a surface parallel to the surface of the substrate 435;

(2) a construction in which said direction is inclined at any angle in a direction perpendicular to the surface of the substrate 435; and (3) a construction in which the constructions (1) and (2) above are combined together.

Also, it is most preferable from the viewpoint of the light-receiving efficiency to install the photodetector 434 at the point of intersection P between the directions of light emission 431c, 432c and 433c from the laser elements 431, 432 and 433, whereas the photodetector need not always be installed at the point of intersection P, but even if the photodetector is installed at a position more or less deviated from the point of intersection P, it will not affect the light-receiving efficiency.

Further, the photodetector may be installed on the substrate of the laser elements or on the mount of the laser elements by a hybrid system, but if it is formed monolithically with the laser elements, it will lead to the provision of a composite device which requires a smaller number of steps of process and which is higher in reliability.

In the above-described embodiments, the value of the angle $\theta$ formed between the directions of light emission from the light-emitting elements depends on the array interval (1 mm) and the focal length of the optical system used, but in the case of a usually used optical system having a focal length of the order of 20 mm, $1 \leq \theta/1 \leq 50$ would be suitable. For example, in the previously described embodiments, a good result was obtained for $1 = 100$ $\mu$m, Po $= 13$ mm and $\theta = 1.2°$.

The multibeam emitting device of the present invention is useful not only for the deflecting optical system using mechanical scanning as described as an example of the prior art, but for a system using the diffracting action by the surface-active wave (SAW) as light deflecting means. The present invention is not restricted to the above-described embodiments, but various other applications thereof are possible.

What is claimed is:

1. A multibeam emitting device provided with a plurality of semiconductive light-emitting elements monolithically formed on a semiconductor substrate, in which said semiconductive light-emitting elements each comprise a laser active portion and a diffraction grating portion, the directions of arrangement of the diffraction gratings of said elements are formed radially about a predetermined point, and the directions of emission of the lights emitted from said elements differ from one another.

2. A multibeam emitting device provided with a plurality of semiconductive light-emitting elements monolithically formed on a same semiconductor substrate, in which each of said semiconductive light-emitting elements has a pair of light emitting end surfaces opposite to each other and a pair of stripe-like electrodes crossing between said end surfaces, wherein in at least one of said light-emitting elements, a different amount of current is injected relative to the other light-emitting elements so as to cause the directions of emission of lights from said elements to differ from each other.

3. A multibeam emitting device according to claim 2, wherein said elements are formed so that the light-emitting end surfaces thereof form a non-zero finite angle with one another.

4. A multibeam emitting device provided with a plurality of semiconductive light-emitting elements monolithically formed on a semiconductor substrate, each of said elements having an electrode and a stripe-like current injection are into which a current is injected by said electrode and whose lengthwise direction forms a non-zero finite angle with those of other electrodes, said device emitting plural light beams in mutually different directions, wherein the electrode of one light-emitting element is completely separated from the electrodes of other elements and each element is driven independently from other light-emitting elements, and wherein in at least one element, the lengthwise direction of said stripe-like current injection area has an angle not perpendicular to an end surface of said at least one element, a light beam emitted from said at least one element being refracted at the end surface so that an angle between the emitted direction of the refracted light beam and the normal line of the end surface is larger than that between the lengthwise direction of said current injection area and said normal line.

5. A multibeam emitting device according to claim 4, wherein the directions of emission of the lights emitted from said elements are radial about a predetermined point.

6. A multibeam emitting device according to claim 4, wherein said semiconductive light-emitting elements are laser diodes.

* * * * *

UNITED STATES PATENT AND TRADEMARK OFFICE
CERTIFICATE OF CORRECTION

PATENT NO. : 4,971,415

DATED : November 20, 1990

INVENTOR(S) : Toshitami Hara et al

It is certified that error appears in the above-identified patent and that said Letters Patent is hereby corrected as shown below:

COLUMN 5

Line 23, "a" should read --as--.

COLUMN 8

Line 6, "planer" should read --planar--.

COLUMN 9

Line 8, "planer" should read --planar--.
Line 35, "228a 228c" should read --228a-228c--.

COLUMN 10

Line 12, "monothically" should read --monolithically--.

COLUMN 15

Line 21, "of lights" should read --of the lights--.

UNITED STATES PATENT AND TRADEMARK OFFICE
CERTIFICATE OF CORRECTION

PATENT NO. : 4,971,415

DATED : November 20, 1990

INVENTOR(S) : TOSHITAMI HARA ET AL.

It is certified that error appears in the above-identified patent and that said Letters Patent is hereby corrected as shown below:

COLUMN 16

Line 3, "are" should read --area--.

Signed and Sealed this

Twenty-eighth Day of July, 1992

Attest:

DOUGLAS B. COMER

*Attesting Officer*    *Acting Commissioner of Patents and Trademarks*